United States Patent [19]

Fraser et al.

[11] Patent Number: 5,216,392
[45] Date of Patent: Jun. 1, 1993

[54] AUTOMATICALLY CONTROLLED VARACTOR TUNED MATCHING NETWORKS FOR A CRYSTAL FILTER

[75] Inventors: Randall S. Fraser, Plantation; Tam-Thanh C. Buu, Sunrise; Charles R. Ruelke, Davie, all of Fla.

[73] Assignee: Motorola, Inc., Schaumburg, Ill.

[21] Appl. No.: 726,414

[22] Filed: Jul. 5, 1991

[51] Int. Cl.$^5$ .......................... H03H 11/30; H03H 9/56
[52] U.S. Cl. ...................... 333/17.3; 333/32; 333/188
[58] Field of Search ............... 333/188, 17.1, 17.3, 333/32

[56] References Cited

U.S. PATENT DOCUMENTS

| | | | |
|---|---|---|---|
| 1,875,347 | 9/1932 | Meissner | 333/188 X |
| 2,227,824 | 1/1941 | Crosby | 333/188 |
| 3,047,823 | 7/1962 | Ranky | 333/188 |
| 3,170,120 | 2/1965 | Jensen et al. | 333/188 X |
| 3,939,442 | 2/1976 | Ogita | 333/188 |
| 4,423,394 | 12/1983 | Kinsman | 333/192 |
| 4,442,416 | 4/1984 | Epsom et al. | 333/263 |
| 4,642,505 | 2/1987 | Arvanitis | 310/312 |
| 4,685,150 | 8/1987 | Maier | 455/183 |
| 4,810,974 | 3/1989 | Hulbert et al. | 331/1 A |
| 4,827,266 | 5/1989 | Connell | 331/116 FE |
| 4,910,473 | 3/1990 | Niwa | 331/176 |
| 4,967,165 | 10/1990 | Lee et al. | 331/66 |
| 5,051,711 | 9/1991 | Jones | 333/188 |

Primary Examiner—Robert J. Pascal
Assistant Examiner—Benny Lee
Attorney, Agent, or Firm—Juliana Agon

[57] ABSTRACT

A crystal filter network comprises at least one variable impedance network (103a, 103b), at least one crystal filter (103c), and a control circuit (110). Each variable impedance network (103a, 103b) has a control terminal, a first terminal (37, 39), and a second terminal (38, 40) for connecting a first impedance (113) coupled to the first terminal (37), to a second impedance coupled to the second terminal (38). The crystal filter (103c) is coupled to at least one of the first and second terminals. Coupled to the control terminal, the control circuit (110) electrically varies ($V_1$ and $V_2$) the variable impedance network (103a, 103b) to provide a predetermined impedance characteristic to the crystal filter network (103c).

9 Claims, 3 Drawing Sheets

AUTOMATICALLY CONTROLLED VARACTOR TUNED MATCHING NETWORKS FOR A CRYSTAL FILTER

TECHNICAL FIELD

This invention relates generally to a crystal filter network and more particularly to the frequency response optimization of the crystal filter network.

BACKGROUND

Piezoelectric crystals or quartz resonators, are well known and widely used in the art, and are particularly applicable in the use of high frequency filter networks, such as in radios or other communication devices. One important concern in radio design is the adjustment of the matching components to the crystal filter in the crystal filter network to take into account the loading effects of external components. Thus, appropriate matching is necessary in order to achieve the desired output response waveform in terms of sufficient bandwidth, center frequency, and minimization of ripples. Typically, this adjustment is accomplished in a radio factory by laser trimming matching components such as an inductor or a capacitor that form a tank circuit for matching the input and/or the output of the crystal filter. This extra factor trimming step adds to the cost and cycle time of the radio.

In conventional approaches, the cost of the radio is driven higher than necessary because an expensive crystal filter having an extra wide bandwidth was necessary to compensate for the changing crystal filter network characteristics over temperature. For example, as temperature changes, the center frequency of the filter response waveform of the crystal filter network changes. This is due to changes in the crystal filter itself, the matching networks, and surrounding radio subsystems. However, since the traditional crystal filter has a much wider bandwidth than is needed for room temperature operation, the desired frequency can still pass through the crystal filter network even when the center frequency of the filter has shifted over temperature. A need, therefore, exists for eliminating the radio factory laser trimming of the crystal filter match and to substitute a less costly crystal filter having a narrow bandwidth, while still maintaining an optimum crystal filter network performance over temperature.

SUMMARY OF THE INVENTION

Briefly, according to the invention, a crystal filter network comprises at least one variable impedance network, at least one crystal filter, and at least one control circuit. Each variable impedance network has a control terminal, a first terminal, and a second terminal for matching or coupling a first impedance coupled to the first terminal, to a second impedance coupled to the second terminal. The crystal filter is coupled to at least one of the first and second terminals. Coupled to the control terminal, the at least one control circuit electrically varies the variable impedance network to provide a predetermined impedance transformation or coupling characteristic to the crystal filter network.

DETAILED DESCRIPTION OF THE PREFERRED EMBODIMENT

Figure 1:
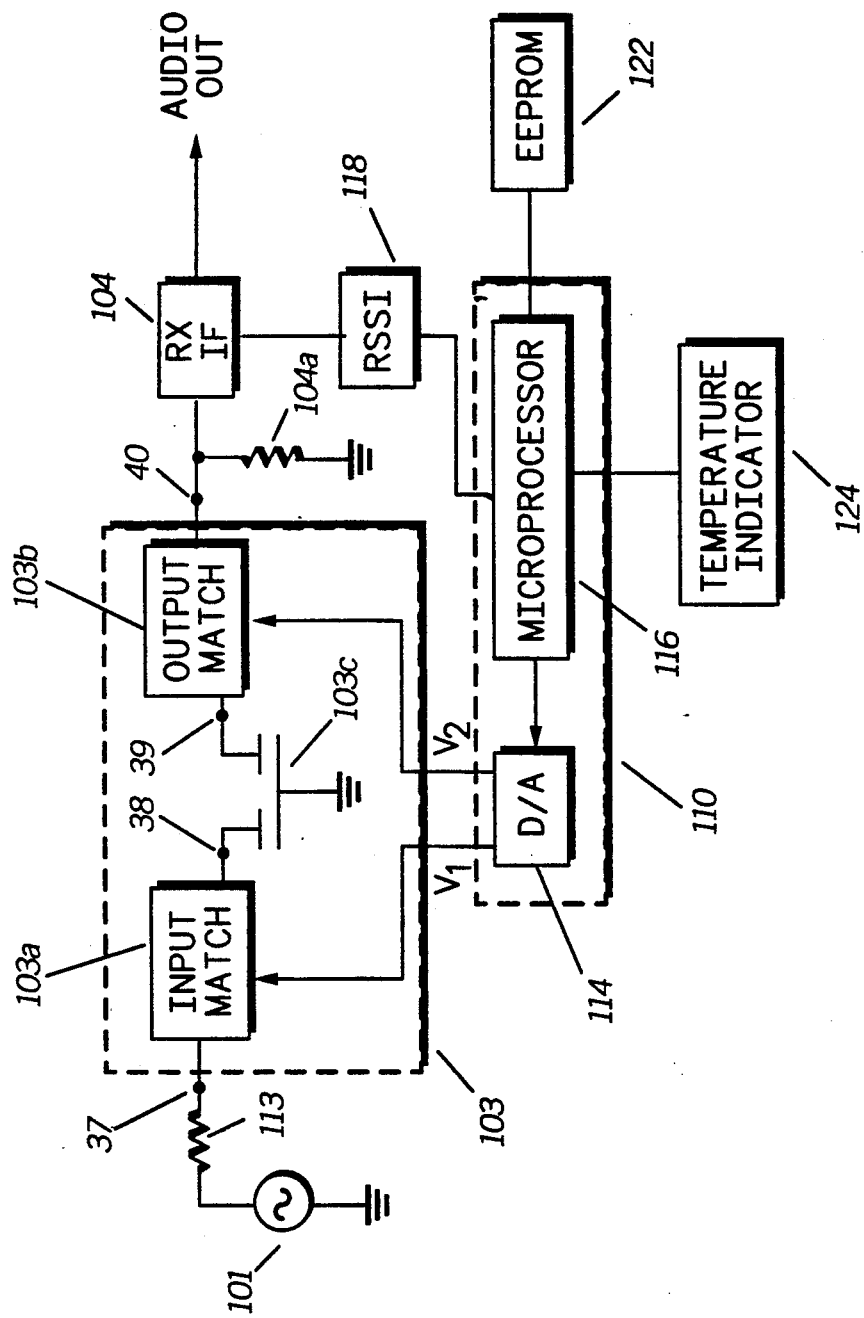
FIG. 1 is a block diagram of the crystal filter network according to the present invention.

Referring to FIG. 1, the crystal filter network according to the present invention can be utilized in a radio which may operate in receive or transmit modes. The radio includes a receiver section and a transmitter section which comprise means for communicating, i.e. transmitting or receiving, communication signals for the radio.

In the receive mode, the portable radio receives a communication signal via an antenna. A transmit/receive switch couples the received communication signal to a mixer. The output of the mixer is applied to a crystal filter network 103 and provides the desired selectivity for the received communication signal.

A signal generator 101, representing a receiver or any other system, provides an input signal that is coupled to an input terminal 37. As described previously, this input signal can be from the front end (which typically includes a preselector, an RF amplifier, and a mixer) of a radio receiver, or can be from a preceding intermediate frequency IF amplifier stage or any other source where this filter network would be used. The signal generator 101 and its output impedance (both real and imaginary), represented by a resistor 113, illustrate such signal sources.

The crystal filter network includes a pair of input and output variable impedance matching tank circuits 103a, 103b, a crystal filter 103c, and a control circuit 110. The crystal filter 103c is coupled in between the input (103a) and output (103b) matching circuits. In order to present or transform the proper impedance to the circuitry external to the crystal filter 103c or in other words to properly load the crystal filter 103c such that an optimum frequency response is achieved at the output of the crystal filter network, each of the variable impedance matching tank circuits 103a, 103b has a respective input terminal 37, 39 and a respective output terminal 38, 40 for matching a first impedance 113 coupled to the input terminal 37, to a second impedance (input impedance of the crystal filter 103c) coupled to the output terminal 38.

As is known, the control voltages for tuning the input and/or output matches 103a, 103b of the crystal filter 103c may be provided by any suitable means including the control circuit 110 comprising a digital-to-analog (D/A) converter 114, having multiple D/A units, coupled to a microprocessor 116. Thus, the control circuit 110 electrically varies at least one of the variable impedance matching circuits 103a and 103b to provide the predetermined matched impedance to properly load the crystal filter 103c such that the desired frequency response waveform is obtained.

The output terminal 40 is connected to a resistor 104a which represents an amplifier or some other portion of a communication system in which the filter network would be used. For example, the output of the filter network 103 can be applied to a well known receiver IF section 104 which recovers the baseband signal. Hence, the input match 103a properly matches the output impedance of a mixer, ( as represented by the resistor 113) for example, to the input impedance of the crystal filter 103c. Similarly, the output match 103b matches the output impedance of the crystal filter 103c to the input impedance 104a of the IF section 104. The output of the receiver IF section is applied to a well known audio section which among other things amplifies audio messages and presents them to a speaker (not shown).

Figure 3:
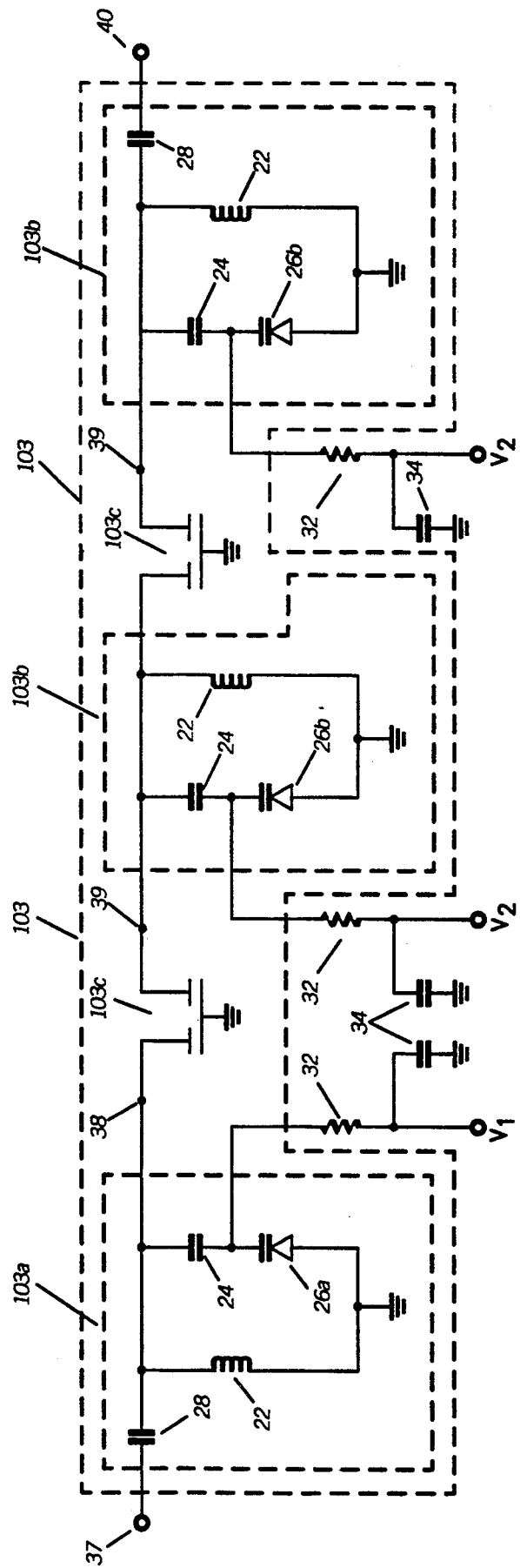
FIG. 3 is a schematic diagram of an alternative embodiment of the varactor tuned crystal filter network, in accordance with the present invention.

In the event that more selectivity is desired, two or more crystal filters 103c can be coupled by an intermediate coupling network similar to the matching network 103a or 103b but without a pair of capacitor 28 as seen in FIG. 3. The varactor 26a or 26b would now be tuned for better coupling between the crystal filters. Hence, the impedance characteristics of the varactor tuned filter can be controlled for impedance transformation, coupling, or other purposes.

Figure 2:
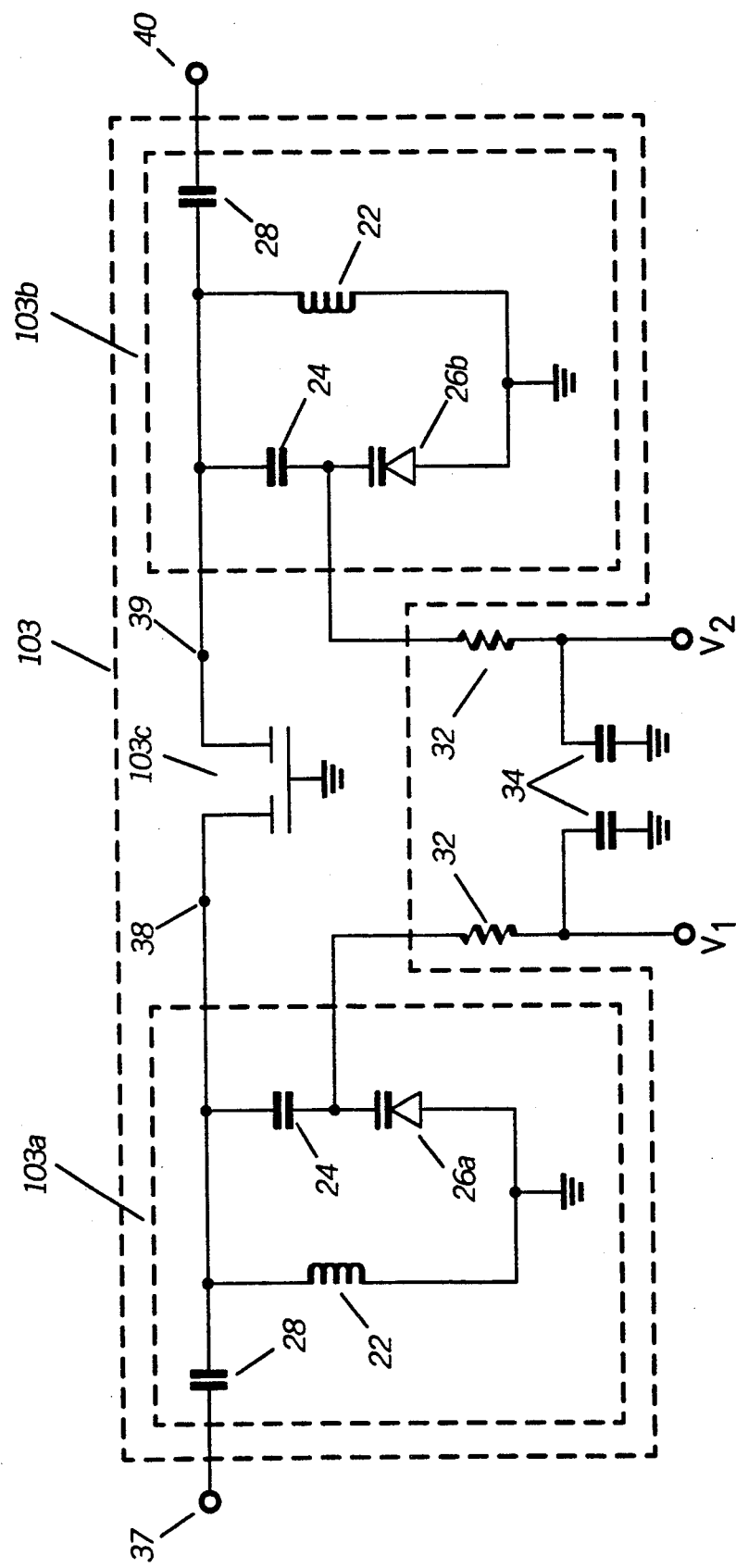
FIG. 2 is a schematic diagram of the varacter tuned crystal filter network of FIG. 1.

Referring to FIG. 2, a schematic diagram of the crystal filter network of FIG. 1 is shown. Series capacitors 28 in combination with inductors 22 form a pair of well known two element impedance transforming networks. Varactors 26a, 26b and DC blocking capacitors 24 provide a means for varying the capacitance in a pair of tank circuits formed with the inductor 22. The addition of this variable capacitance means in parallel with the inductor 22 allows the effective inductance of the tank circuit to be varied to any desired value. Hence, the impedance transformation ratio can now be changed to any desired level.

Referring to both FIGS. 1 and 2, since the impedance (113 and 104a) presented by the external circuitries may be different such a mixer and the IF section 104, for providing an audio output AUDIO OUT a DC voltage source $V_1$ from a D/A 114 may be different from another DC voltage source $V_2$ from another unit of the D/A 114. The pair of control voltages $V_1$ and $V_2$ set the potential across the varactors 26a and 26b to vary their capacitances. The resistors 32 and capacitors 34 (see FIG. 2) form an RF bypass circuit to prevent RF signals from reaching the controlled circuit 110 of FIG. 1.

Since the highest strength of the received signal should correspond to an optimized waveform centered about the desired signal, a radio incorporating the filter network is initially varactor tuned at the factory for the optimum frequency response waveform at room temperature based on the highest received signal strength as detected by the receive signal strength indicator RSSI 118 (and/or viewing the frequency response waveform with a spectrum analyzer). The reference voltage settings for the control voltages $V_1$ and $V_2$ producing the highest RSSI readings are then recorded in a memory, such as an electrically erasable programmable memory (EEPROM) 122 (see FIG. 1) as the reference controlled voltages.

Similarly, over a temperature range the optimum voltage settings for $V_1$ and $V_2$ are predetermined and recorded in the EEPROM 122 in a previous testing process. The temperature compensation data stored in the EEPROM 122 (see FIG. 1) are predetermined by characterizing the individual or general type of filters used for best possible temperature compensation. Each filter would be individually tested and its optimum voltage levels recorded across the temperature range for best crystal filter response (i.e. optimal selectivity, ripple, and insertion loss) when the filter interacts with the rest of the radio components (i.e. external impedances). However, if the crystal filters are similar, a general filter type would only need to be characterized.

At each temperature span, the actual voltage settings necessary for $V_1$ and $V_2$ or the offset voltages from the room temperature voltage reference needed to achieve the desired frequency response waveform taking into effect the external loading of the external circuitries over temperature are recorded and stored in the EEPROM 122. Hence, the EEPROM 122 stores data corresponding to a plurality of temperature spans for readjusting the varactors 26a, 26b at each temperature span and an optimized temperature compensation or offset voltage is generated for each predetermined temperature span.

Referring again to FIG. 1, a temperature indicator 124 is coupled to the microprocessor 116 for use with the temperature compensation data stored in the EEPROM 122. The temperature indicator 124 may include three series diodes, a thermistor, or any other suitable temperature sensing means. As temperature changes, when the radio is in use by an operator, the temperature indicator 124 senses this temperature change. The microprocessor 116 uses this temperature information to select corresponding temperature data (the offset voltages for this temperature or temperature span) from the memory for compensation at this temperature. This information from the EEPROM 12 is translated to the D/A converter 114 to provide the control voltages $V_1$ and $V_2$ to re-optimize the crystal filter match for the optimum frequency response.

In summary, the microprocessor continuously monitors the receiver's operating temperature. Any variation in temperature above a plurality of different temperature thresholds corresponding to different temperature spans, causes the microprocessor to retrieve new temperature compensation data or information from the EEPROM. The information from the EEPROM is translated to the D/A converter to re-optimize the crystal filter match. The D/A converter applies at least one control voltage to the varactor diodes incorporated into the crystal filter input and/or output matches. The different control voltages change the varactor diodes capacitance, which in turn retunes the crystal filter response for optimal selectivity, ripple, and insertion loss.

What is claimed is:

1. A crystal filter network comprising:
   a crystal having an input end and an output end; impedance matching section connected to either the input end or the output end of the crystal,
   the matching section comprising a first series coupling of a terminal and a first capacitor, and further comprising an inductor connected from the first capacitor to ground, a second series coupling of a second capacitor and a varactor diode, the second series coupling electrically coupled in parallel to the inductor, each of said capacitors being connected to said input end or output end of the crystal which is connected to the matching section;
   a DC control voltage; and
   a biasing resistor is connected to a junction between the varactor diode and the second capacitor of the matching section, the biasing resistor also connected to said DC control voltage.

2. The crystal filter network of claim 1 further comprising:
   temperature sensing means for sensing an ambient temperature;
   memory means for storing data corresponding to a plurality of temperature spans; and
   temperature compensation means, connected to the temperature sensing means and to the memory means for providing the DC control voltage in response to the ambient temperature.

3. The crystal filter network of claim 2 wherein the temperature compensation means comprises a control circuit.

4. The crystal filter network of claim 3 wherein the control circuit comprises:
processing means coupled to the memory means and the temperature sensing means to retrieve compensation data from the memory means for use at the ambient temperature; and
a digital-to-analog (D/A) converter, responsive to the retrieved compensation data, to convert the retrieved compensation data into the DC control voltage.

5. An adjustable crystal filter network comprising:
a first crystal and a second crystal electrically coupled in series to form a junction between adjacent crystals, the first crystal having an input end and the second crystal having an output end; an intermediate coupling section is connected a said junction between adjacent crystals the intermediate coupling section comprises an inductor connected from the junction to ground, a first series coupling of a capacitor and a varactor diode, the first series coupling electrically coupled in parallel to the inductor;
an input impedance matching section connected to said input end;
an output impedance matching section connected to said output end;
the input section and the output section each comprising a second series coupling of a terminal and a series capacitor, and further comprising an inductor connected from the series capacitor to ground, a third series coupling of a capacitor and a varactor diode, the third series coupling electrically coupled in parallel to the inductor, each of the series capacitors being connected to the respective input end or output end
a plurality of DC control voltages; and
a plurality of biasing resistors, each one of the plurality of resistors is connected between respective junctions of the varactor diode and the capacitor of the input matching section, the output matching section, and the intermediate coupling section, each of the biasing resistors also connected to a respective one of said plurality of DC control voltages.

6. A crystal filter network in a radio, the crystal filter network comprising:
a crystal having an input end and an output end;
an input impedance matching section and an output impedance matching section respectively connected to the respective input end and output end of the crystal;
the input section and the output section each comprising a first series coupling of a terminal and a series capacitor, and further comprising an inductor connected from the series capacitor to ground, a second series coupling of a capacitor and a varactor diode, the second series coupling electrically coupled in parallel to the inductor, each of the series capacitors being connected to the respective input end or output end of the crystal;
a plurality of DC control voltages; and
a plurality of biasing resistors, each one of the plurality of resistors is connected between respective junctions of the varactor diode and the capacitor of the input matching section and the output matching section, each of the biasing resistors also connected to a respective one of said plurality of DC control voltages.

7. The crystal filter network of claim 6 further comprising:
temperature sensing means for sensing an ambient temperature;
memory means for storing data corresponding to a plurality of temperature spans; and
temperature compensation means, connected to the temperature sensing means and to the memory means for providing the plurality of DC control voltages in response to the ambient temperature.

8. The crystal filter network of claim 7 wherein the temperature compensation means comprises a control circuit.

9. The crystal filter network of claim 8 wherein the control circuit comprises:
processing means coupled to the memory means and the temperature sensing means to retrieve compensation data from the memory means for use at the ambient temperature; and
a digital-to-analog (D/A) converter, responsive to the retrieved compensation data, to convert the retrieved compensation data into the plurality of DC control voltage voltages.

* * * * *